(12) United States Patent
Lee et al.

(10) Patent No.: US 10,757,846 B2
(45) Date of Patent: Aug. 25, 2020

(54) ELECTRONIC DEVICE INCLUDING SHIELDING MEMBER CONNECTED TO CONDUCTIVE PLATE COVERING OPENING OF SHIELD CAN

(71) Applicant: Samsung Electronics Co., Ltd., Gyeonggi-do (KR)

(72) Inventors: Haejin Lee, Gyeonggi-do (KR); Min Park, Gyeonggi-do (KR); Jungje Bang, Gyeonggi-do (KR); Kyungha Koo, Gyeonggi-do (KR); Yunjeong Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/535,528

(22) Filed: Aug. 8, 2019

(65) Prior Publication Data
US 2020/0053919 A1 Feb. 13, 2020

(30) Foreign Application Priority Data
Aug. 8, 2018 (KR) .......................... 10-2018-0092330

(51) Int. Cl.
*H05K 9/00* (2006.01)
*H05K 1/02* (2006.01)
(52) U.S. Cl.
CPC .......... *H05K 9/0026* (2013.01); *H05K 1/0204* (2013.01); *H05K 9/009* (2013.01); *H05K 9/0084* (2013.01)
(58) Field of Classification Search
CPC .................................................. H05K 9/0026
See application file for complete search history.

(56) References Cited

U.S. PATENT DOCUMENTS

| 2014/0078677 A1 | 3/2014 | Dolci et al. |
| 2014/0268578 A1 | 9/2014 | Dolci et al. |
| 2015/0208550 A1* | 7/2015 | Rugg ................. H05K 7/20518 361/713 |
| 2017/0181264 A1 | 6/2017 | Brey |
| 2019/0281734 A1* | 9/2019 | Seo ...................... H05K 9/0026 |

FOREIGN PATENT DOCUMENTS

| JP | 2012-210000 | 10/2012 |
| KR | 1020180048297 | 5/2018 |
| KR | 1020180068308 | 6/2018 |

OTHER PUBLICATIONS

International Search Report dated Nov. 12, 2019 issued in counterpart application No. PCT/KR2019/009195, 10 pages.

* cited by examiner

*Primary Examiner* — Hung V Ngo
(74) *Attorney, Agent, or Firm* — The Farrell Law Firm, P.C.

(57) ABSTRACT

Provided is an electronic device including a printed circuit board (PCB) in which at least one electrical element is disposed; a shield can including a concave portion and an opening formed in part of the concave portion and configured to receive the at least one electrical element at an inside of the concave portion disposed on the PCB; a conductive plate configured to cover the opening at an outside of the concave portion; a support member disposed between the conductive plate and the outside of the concave portion; and a shielding member disposed between the support member and the outside of the concave portion and connected to at least part of the conductive plate extended in a direction of the opening from the support member and configured to cover the opening.

20 Claims, 16 Drawing Sheets

ELECTRONIC DEVICE INCLUDING SHIELDING MEMBER CONNECTED TO CONDUCTIVE PLATE COVERING OPENING OF SHIELD CAN

CROSS-REFERENCE TO RELATED APPLICATION(S)

This application is based on and claims priority under 35 U.S.C. 119 to Korean Patent Application No. 10-2018-0092330, filed on Aug. 8, 2018, in the Korean Intellectual Property Office, the disclosure of which is incorporated by reference herein in its entirety.

BACKGROUND

1. Field

The present disclosure relates generally to an electronic device including a shielding member connected to a conductive plate that covers an opening of a shield can.

2. Description of Related Art

Nowadays, electronic devices are gradually becoming smaller, but the functions thereof are gradually becoming more diversified. Electrical elements received in the electronic devices may be disposed to have a gradually smaller gap with peripheral structures, and high temperature and/or noise may occur. Because high temperature and/or noise may cause a malfunction of an electronic device, various methods are being sought that can effectively perform a heat radiation operation and/or a noise shielding operation.

An electronic device may include a shield can of a metal material disposed in a manner to enclose electrical elements in order to shield noise emitted from the electrical elements disposed therein. Because the shield can is disposed in a sealed manner enclosing the electrical element, the shield can may effectively shield noise generated in the electrical element, but heat generated in the electrical element cannot be released effectively by a shield structure of the shield can. To solve this issue, the shield can may include an opening, which is a heat transfer passage formed in at least some areas. Therefore, the opening may be disposed between the electrical element and a thermal diffusion structure (e.g., a heat radiating sheet, a heat radiating plate, a heat pipe, a vapor chamber, or a metal bracket) of an upper end of the shield can to be used as a communication path of a thermal conductive material (e.g., a thermal interface material (TIM)) for transferring heat).

Such an opening may be used as an effective heat transfer path, but noise emitted from the electrical device may be leaked to the outside.

SUMMARY

An aspect of the present disclosure provides an electronic device including a shielding member connected to a conductive plate that covers an opening of a shield can that can effectively perform heat radiation and shielding operations.

In accordance with an aspect of the present disclosure, an electronic device is provided. The electronic device includes a printed circuit board (PCB) in which at least one electrical element is disposed; a shield can including a concave portion and an opening formed in part of the concave portion and configured to receive the at least one electrical element at an inside of the concave portion disposed on the PCB; a conductive plate configured to cover the opening at an outside of the concave portion; a support member disposed between the conductive plate and the outside of the concave portion; and a shielding member disposed between the support member and the outside of the concave portion and connected to at least part of the conductive plate extended in a direction of the opening from the support member and configured to cover the opening.

In accordance with another aspect of the present disclosure, an electronic device is provided. The electronic device includes a PCB in which at least one electrical element is mounted; a shield can including a plate in which a first opening is formed and a side surface extended to a predetermined height along an edge of the plate and disposed on the PCB such that the at least one electrical element is received in a concave portion formed by the side surface and the plate; and a shielding assembly disposed at an outer surface of the plate and configured to seal the first opening, wherein the shielding assembly includes a shielding member attached to an outer surface of the shield can and including a second opening overlapped with at least part of the first opening when viewed from above the shield can; a support member stacked on the shielding member and including a third opening overlapped with at least part of the first opening when viewed from above the shield can; and a conductive plate stacked on the support member and configured to seal the third opening, wherein at least part of the shielding member adjacent to the second opening is configured to contact the conductive plate through the third opening.

In accordance with another aspect of the present disclosure, a shielding assembly attached to an outer surface of a shield can having an opening in a concave portion that can receive at least one electronic component is provided. The shielding assembly includes a conductive plate, a support member disposed below the conductive plate and in which another opening corresponding to the opening is formed, and a shielding member disposed below the support member and extended in a direction of the opening from the support member connected to at least part of the conductive plate covering the opening.

BRIEF DESCRIPTION OF THE DRAWINGS

The above and other aspects, features, and advantages of the present disclosure will be more apparent from the following detailed description, taken in conjunction with the accompanying drawings, in which.

DETAILED DESCRIPTION

Figure 1:
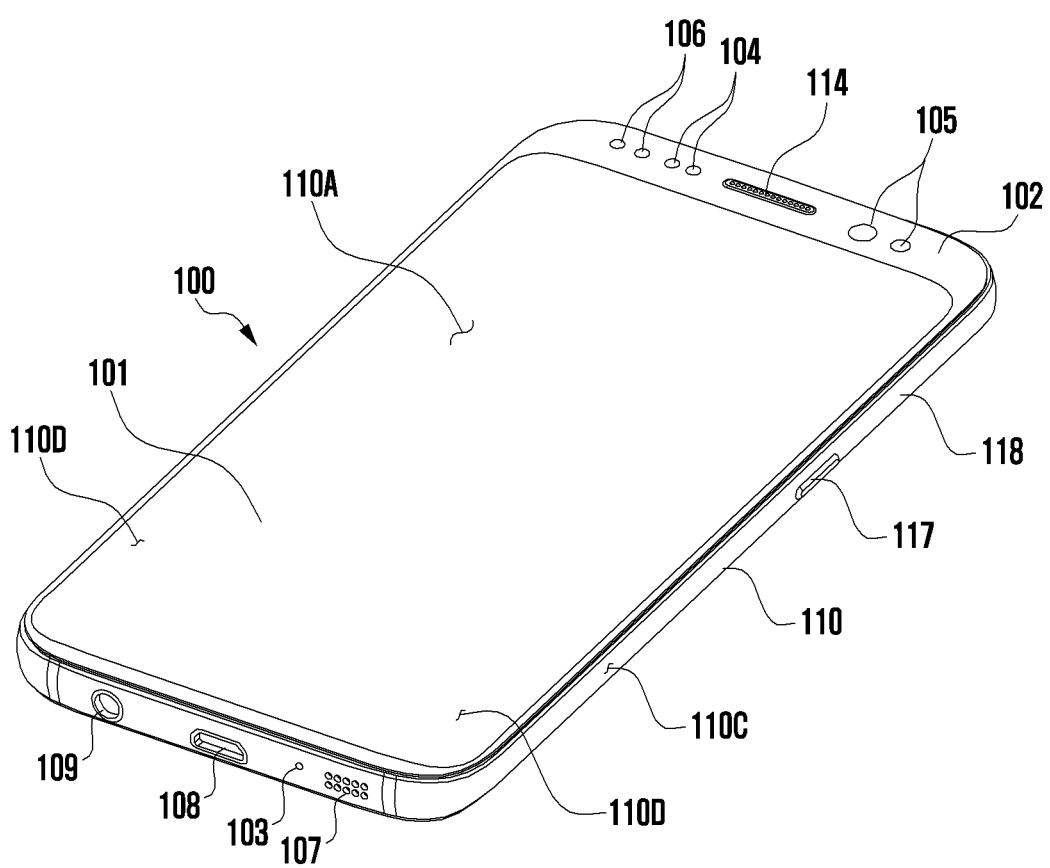
FIG. 1 is a perspective view of a front surface of a mobile electronic device according to an embodiment.
Figure 2:
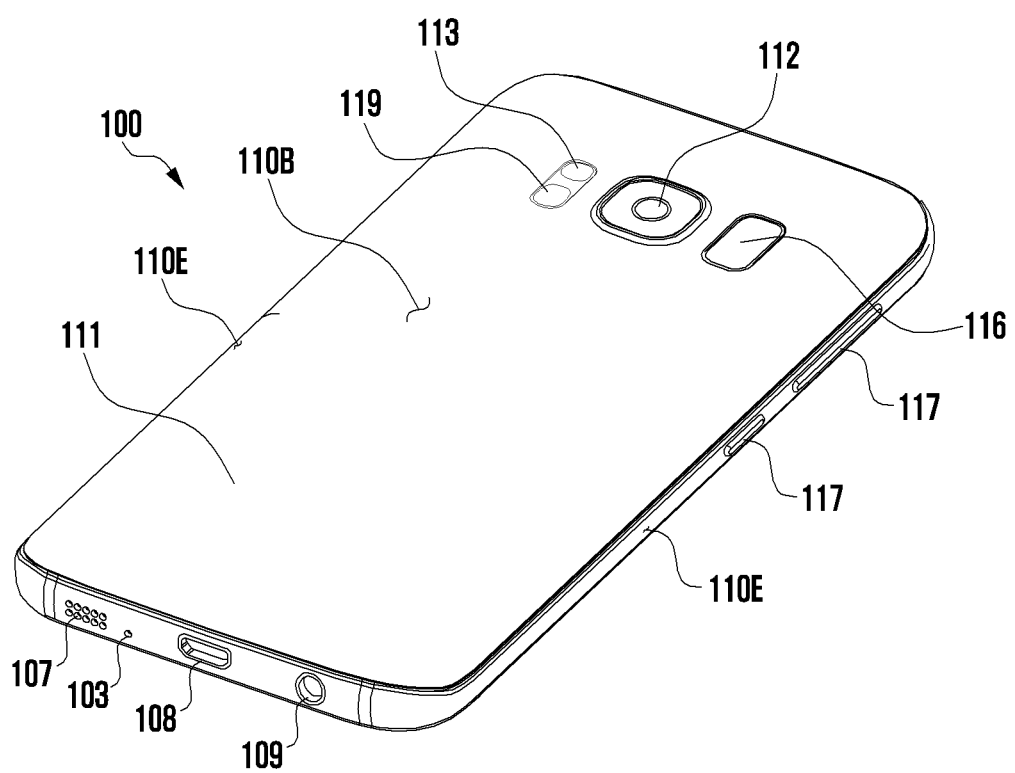
FIG. 2 is a perspective view of a rear surface of the electronic device of FIG. 1 according to an embodiment.

Referring to FIG. 1 and FIG. 2, an electronic device 100 may include a housing 110 including a first surface (or front surface) 110A, a second surface (or rear surface) 110B, and a side surface 110C surrounding the space between the first surface 110A and the second surface 110B. In an embodiment, the housing 110 may denote a structure that forms a part of the first surface 110A, the second surface 110B, and the side surface 110C illustrated in FIG. 1. According to an embodiment, the first surface 110A may be formed by a front plate 102, at least a part of which is substantially transparent (for example, a glass plate including various coating layers, or a polymer plate). The second surface 110B may be formed by a rear plate 111 that is substantially opaque. The rear plate 111 may be made of coated or colored glass, ceramic, polymer, metal (for example, aluminum, stainless steel (SUS), or magnesium), or a combination of at least two of the above-mentioned materials. The side surface 110C may be formed by a side bezel structure (or side member) 118 which is coupled to the front plate 102 and to the rear plate 111, and which includes metal and/or polymer. The rear plate 111 and the side bezel structure 118 may be integrally formed and may include the same material (for example, a metal material such as aluminum).

The front plate 102 may include two first areas 110D on both ends of the long edge of the front plate 102 such that the two first areas 110D bend from the first surface 110A toward the rear plate 111 and extend seamlessly. The rear plate 111 may include two second areas 110E on both ends of the long edge such that the two second areas 110E bend from the second surface 110B toward the front plate 102 and extend seamlessly. The front plate 102 (or the rear plate 111) may include only one of the first areas 110D (or the second areas 110E). A part of the first areas 110D or the second areas 110E may be omitted. In the above embodiments, when seen from the side surface of the electronic device 100, the side bezel structure 118 may have a first thickness (or width) on a part of the side surface, which does not include the first areas 110D or the second areas 110E as described above, and may have a second thickness that is less than the first thickness on a part of the side surface, which includes the first areas 110D or the second areas 110E.

The electronic device 100 may include at least one of a display 101, audio modules 103, 107, and 114, sensor modules 104, 116, and 119, camera modules 105, 112, and 113, a key input device 117, a light-emitting element 106, and connector holes 108 and 109. In some embodiments, at least one of the elements (for example, the key input device 117 or the light-emitting element 106) of the electronic device 100 may be omitted, or the electronic device 100 may additionally include another element.

The display 101 may be exposed through a corresponding part of the front plate 102, for example. At least a part of the display 101 may be exposed through the front plate 102 that forms the first areas 110D of the side surface 110C and the first surface 110A. The display 101 may have a corner formed in substantially the same shape as that of the adjacent outer periphery of the front plate 102. In order to increase the area of exposure of the display 101, the interval between the outer periphery of the display 101 and the outer periphery of the front plate 102 may be formed to be substantially identical.

A recess or an opening may be formed in a part of the screen display area of the display 101, and at least one of the audio module 114, the sensor module 104, the camera module 105, and the light-emitting element 106 may be included and aligned with the recess or the opening. On the back surface of the screen display area of the display 101, at least one of the audio module 114, the sensor module 104, the camera module 105, the fingerprint sensor 116, and the light-emitting element 106 may be included. In another embodiment, the display 101 may be coupled to or arranged adjacent to a touch sensing circuit, a pressure sensor capable of measuring an intensity (e.g., pressure) of a touch, and/or a digitizer that detects a magnetic field-type stylus pen. At least a part of the sensor modules 104 and 119 and/or at least a part of the key input device 117 may be arranged in the first areas 110D and/or the second areas 110E.

The audio modules 103, 107, and 114 may include a microphone hole 103 and speaker holes 107 and 114. A microphone for acquiring an external sound may be arranged in the microphone hole 103, and a plurality of microphones may be arranged therein such that the direction of a sound may be sensed in some embodiments. The speaker holes 107 and 114 may include an outer speaker hole 107 and a speech receiver hole 114. The speaker holes 107 and 114 and the microphone hole 103 may be implemented as a single hole, or a speaker may be included (for example, a piezoelectric speaker) without the speaker holes 107 and 114.

The sensor modules 104, 116, and 119 may generate an electrical signal or a data value corresponding to the internal operating condition of the electronic device 100 or the external environment condition thereof. The sensor modules 104, 116, and 119 may include, for example, a first sensor module 104 (for example, a proximity sensor) arranged on the first surface 110A of the housing 110, and/or a second sensor module ((for example, a fingerprint sensor), and/or a third sensor module 119 (for example, a heart rate monitor (HRM) sensor) arranged on the second surface 110B of the housing 110, and/or a fourth sensor module 116 (for example, a fingerprint sensor). A fingerprint sensor may be arranged not only on the first surface 110A (for example, the display 101) of the housing 110, but also on the second surface 110B thereof. The electronic device 100 may further include a sensor module, for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or a luminance sensor 104.

The camera modules 105, 112, and 113 may include a first camera device 105 arranged on the first surface 110A of the electronic device 100, a second camera device 112 arranged on the second surface 110B thereof, and/or a flash 113. The camera devices 105 and 112 may include a single lens or a plurality of lenses, an image sensor, and/or an image signal processor. The flash 113 may include, for example, a light-emitting diode or a xenon lamp. Two or more lenses (e.g., an IR camera, a wide-angle lens, and a telephoto lens) and image sensors may be arranged on a single surface of the electronic device 100.

The key input device 117 may be arranged on the side surface 110C of the housing 110. The electronic device 100 may omit a part of the above-described key input device 117 or the entire key input device 117, and the key input device 117 may be implemented in another type, such as a soft key, on the display 101. In some embodiments, the key input device 117 may include a sensor module 116 arranged on the second surface 110B of the housing 110.

The light-emitting element 106 may be arranged on the first surface 110A of the housing 110, for example. The light-emitting element 106 may provide information regarding a condition of the electronic device 100 in a light type, for example. The light-emitting element 106 may provide a light source that interoperates with the camera module 105, for example. The light-emitting element 106 may include, for example, a light-emitting diode (LED), an IR LED, and a xenon lamp.

The connector holes 108 and 109 may include a first connector hole 108 capable of containing a connector (for example, a universal serial bus (USB) connector) for transmitting/receiving power and/or data to/from an external electronic device, and/or a second connector hole (for example, an earphone jack) 109 capable of containing a connector for transmitting/receiving an audio signal to/from the external electronic device.

Figure 3:
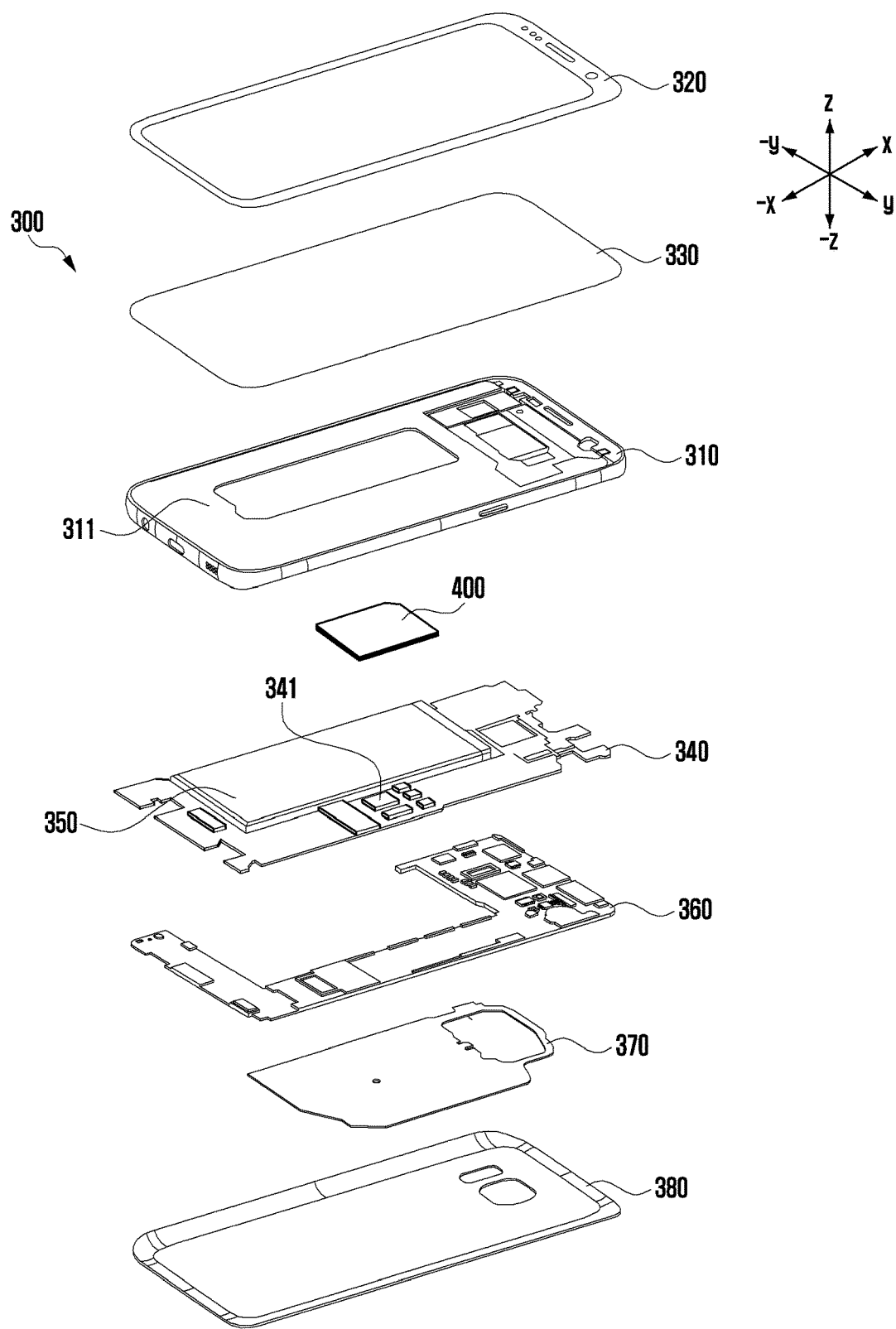
FIG. 3 is an exploded perspective view of the electronic device of FIG. 1 according to an embodiment.

Referring to FIG. 3, the electronic device 300 may include a side bezel structure 310, a first support member 311 (for example, a bracket), a front plate 320, a display 330, a PCB 340, a battery 350, a second support member 360 (for example, a rear case), an antenna 370, and a rear plate 380. At least one of the elements (for example, the first support member 311 or the second support member 360) of the electronic device 300 may be omitted, or the electronic device 300 may further include another element. At least one of the elements of the electronic device 300 may be identical, or similar, to at least one of the elements of the electronic device 100 of FIG. 1 or FIG. 2, and repeated descriptions thereof are omitted herein.

The first support member 311 may be arranged inside the electronic device 300 and connected to the side bezel structure 310, or may be integrally formed with the side bezel structure 310. The first support member 311 may be made of a metal material and/or a nonmetal (for example, polymer) material, for example. The display 330 may be coupled to one surface of the first support member 311, and the PCB 340 may be coupled to the other surface thereof. A processor, a memory, and/or an interface may be mounted on the PCB 340. The processor may include, for example, one or more of a central processing unit (CPU) or device, an application processor (AP), a graphic processing unit (GPU) or device, an image signal processor (ISP), a sensor hub processor, or a communication processor (CP).

The memory may include a volatile memory or a non-volatile memory, for example.

The interface may include, for example, a high definition multimedia interface (HDMI), a USB interface, a secure digital (SD) card interface, and/or an audio interface. An interface may connect the electronic device 300 with an external electronic device electrically or physically, for example, and may include a USB connector, an SD card/multimedia card (MMC) connector, or an audio connector.

The battery 350 is a device for supplying power to at least one element of the electronic device 300, and may include a non-rechargeable primary cell, a rechargeable secondary cell, or a fuel cell, for example. At least a part of the battery 350 may be arranged on substantially the same plane with the PCB 340, for example. The battery 350 may be arranged integrally inside the electronic device 300, or may be arranged such that the same can be attached to/detached from the electronic device 300.

The antenna 370 may be arranged between the rear plate 380 and the battery 350. The antenna 370 may include, for example, a near field communication (NFC) antenna, a wireless charging antenna, and/or a magnetic secure transmission (MST) antenna. The antenna 370 may conduct near-field communication with an external device or may wirelessly transmit/receive power necessary for charging, for example. An antenna structure may be formed by a part or a combination of the side bezel structure 310 and/or the first support member 311.

In the PCB 340, at least one electrical element 341 (e.g., an electronic component) may be mounted. The at least one electrical element 341 may include at least one processor and a surface mounting device (SMD) type integrated circuit or chip for performing at least one corresponding function. The electrical element 341 mounted in the PCB 340 may cause heat generation and noise generation. The electronic device 300 may include a shield structure 400 for radiating heat generated in the electrical element 341 to the outside and effectively shielding noise. When the electronic device 300 is assembled, the shield structure 400 may be disposed in a manner enclosing a periphery of the electrical elements 341 of the PCB 340 through an automation process to improve process efficiency. After being mounted in the PCB 340 by an automation process, the shield structure 400 may simultaneously perform an effective heat radiation operation and a noise shielding operation.

Hereinafter, a certain configuration of the shield structure 400 is described.

Figure 4A:
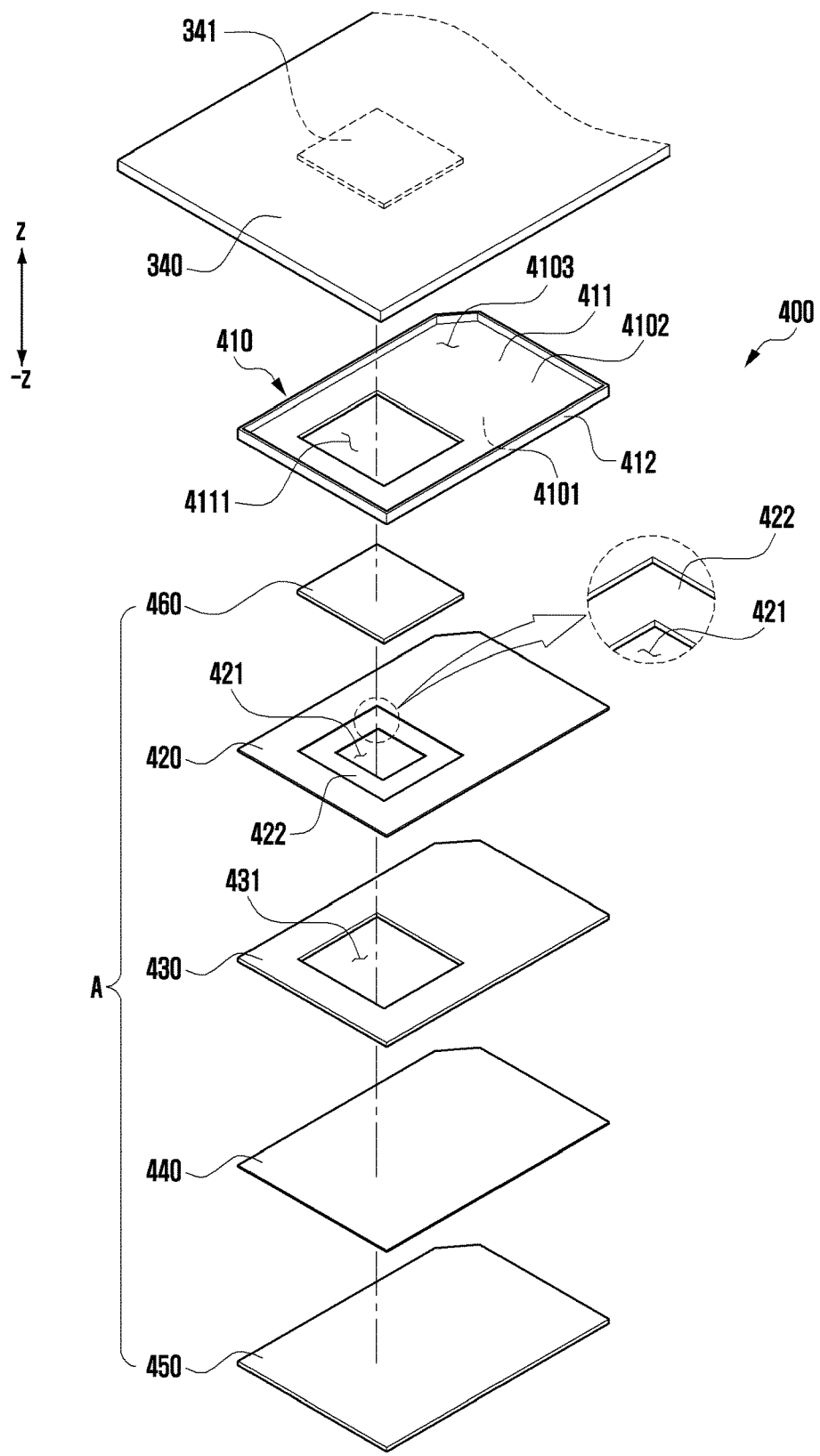
FIG. 4A is an exploded perspective view illustrating a shield structure according to an embodiment.
Figure 4B:
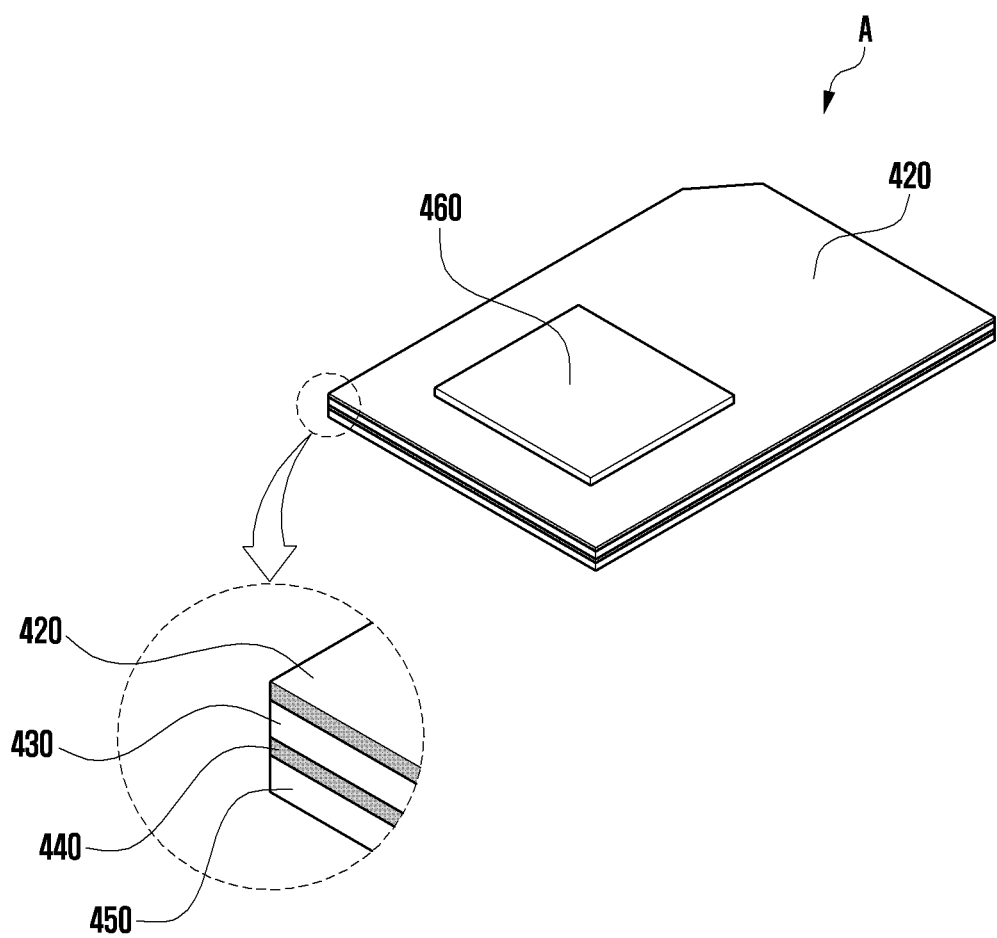
FIG. 4B is a diagram illustrating a shielding assembly of a shield structure that may be mounted in an electronic device in an automation process according to an embodiment.

FIG. 4A is an exploded perspective view illustrating a shield structure 400 according to an embodiment. FIG. 4B is a diagram illustrating a shielding assembly A of the shield structure 400 of FIG. 4A for an automation process according to an embodiment.

In a description below with reference to FIGS. 4A and 4B, in order to facilitate understanding of the present disclosure, it is illustrated that the shield structure 400 and the PCB 340 are disposed in a reverse direction, but a mounting direction (e.g., a Z direction to −Z direction) of the shield structure 400 is illustrated in FIGS. 3 and 4A.

Referring to FIG. 4A, the shield structure 400 may include a PCB 340 including the electrical element 341, a shield can 410 disposed such that the electrical element 341 of the PCB 340 is at least partially sealed; a first thermal conductive member 460 for penetrating the shield can 410; and a shielding member 420, a support member 430, a conductive plate 440, and a second thermal conductive member 450 sequentially stacked in an upper portion of the shield can 410.

The shield can 410 may include a plate 411 and a side surface 412 extended to have a predetermined height along an edge of the plate 411. The shield can 410 may include a concave portion 4103 (e.g., a recess) formed to receive the electrical element 341 by the plate 411 and the side surface 412. The shield can 410 may be mounted to seal the electrical element 341 in the PCB 340. When the shield can 410 is mounted in the PCB 340, the shield can 410 may be electrically connected to a ground of the PCB 340. In this case, as the side surface 412 of the shield can 410 is soldered to the ground of the PCB 340, the shield can 410 may be fixed to, and electrically connected to, the PCB 340. In an embodiment, the side surface 412 of the shield can 410 may be disposed to be fixed by a separate fixing member (e.g., a metal frame) fixed to be electrically connected to the ground of the PCB 340. When viewed from above the shield can 410 (e.g., when viewed in a −Z direction), the shield can 410 may include a first opening 4111 of a predetermined size formed in the plate 411 at a position in which at least a partial region of the electrical element 341 is overlapped. The first opening 4111 may function as a heat transfer path that transfers heat emitted from the electrical element 341 to the outside. The plate 411 of the shield can 410 may include a first surface 4101 (e.g., an outer surface) and a second surface 4102 opposite to the first surface 4101 and disposed in a direction facing the electrical element 341. When the shield can 410 is mounted in the PCB 340, the shield can 410 may be disposed so that at least part of the electrical element 341 may be viewed through the first opening 4111 and may be disposed so that the second surface 4102 and the electrical element 341 have a separated space at a predetermined gap in a vertical direction (e.g., Z and −Z directions) in the concave portion 4103.

The shielding member 420 may include a second opening 421 formed at a position overlapped with at least part of the first opening 4111 of the shield can 410, when viewed from above the shield can 410. The second opening 421 may be formed to have no area greater than that of the first opening 4111. In this case, when the shielding member 420 is attached to the first surface 4101 of the shield can 410, the second opening 421 may be disposed to overlap at a position included in the first opening 4111, when viewed from above the shield can 410. The shielding member 420 may include an extended portion 422 stepped to be lower than a surface of the shielding member 420 along an edge of the second opening 421 and extended to have a predetermined width in a direction of the second opening 421. The stepped extended portion 422 and the second opening 421 may be formed by a punching process. The first thermal conductive member 460 may include the second opening 421 of the shielding member 420 to be disposed at a position overlapped with the stepped extended portion 422.

The support member 430 may be disposed between the shielding member 420 and the conductive plate 440. The support member 430 may be made of a material capable of supporting the shielding member 420. When the support member 430 is assembled under a predetermined pressing force, the support member 430 may be made of a material having an elastic deformation ratio greater than a below tolerance for preventing a phenomenon that the first conductive member 460 is separated from the conductive plate 440 and the electric device by an assembly tolerance between each component. The support member 430 may include a porous sponge (e.g., polyurethane foam) or rubber. When viewed from above the shield can 410, the support member 430 may include a third opening 431 formed in a position at least partially overlapped with the first opening 4111. When viewed from above the shield can 410, the third opening 431 may be formed in a size in which at least part of the extended portion 422 of the shielding member 420 may be overlapped with the third opening 431. Therefore, when the shielding member 420, the support member 430, and the conductive plate 440 are sequentially stacked, the extended portion 422 of the shielding member 420 may be attached to the conductive plate 440 exposed to the third opening 431 of the support member 430. This may form an electrical connection structure through the first surface 4101, the shielding member 420, and the conductive plate 440 of the shield can 410 to contribute to effectively shield noise that may leak through the first opening 4111 of the shield can 410. Further, because the shielding member 420 and the support member 430 have an inner joint structure through the third opening 431 of the support member 430, a punching process may be performed without a process (e.g., a wrapping process enclosing the outside of the support member) by a separate jig or device. Thus, a shielding assembly A may be easily produced.

The conductive plate 440 may be bonded to the shielding member 420 to shield the first opening 4111 of the shield can 410 and contact the first thermal conductive member 460 disposed through the third opening 431 of the support member 430, the second opening 421 of the shielding member 420, and the first opening 4111 of the shield can 410 to facilitate an efficient heat radiation operation. The conductive plate 440 may be formed with a SUS alloy or a copper (Cu) alloy.

The first thermal conductive member 460 may be disposed to overlap in the extended portion 422 of the shielding member 420, where one surface thereof may contact the electrical element 341, and the other surface thereof may contact the conductive plate 440 through the first opening 4111 of the shield can 410, the second opening 421 of the shielding member 420, and the third opening 431 of the support member 430. The first thermal conductive member 460 may include a material in which thermal conductive particles or carbon fibers are mixed in a synthetic resin. The thermal conductive particles may include aluminum oxide ($Al_2O_3$) or aluminum nitride (AlN) particles. A synthetic resin of the first thermal conductive member 460 may include a silicon or acrylic series synthetic resin. As carbon fibers of the first thermal conductive member 460 are aligned and disposed in a direction perpendicular to the electric element, heat generated in the electrical element 341 may be easily transferred to the conductive plate 440 in a vertical direction. The first thermal conductive member 460 may include a solid or liquid TIM having thermal conductivity in a range of about 2 Watts per meter-Kelvin (W/mK) to about 100 W/mK.

The second thermal conductive member 450 attached to the conductive plate 440 may include a TIM. The second thermal conductive member 450 may include a material in which thermal conductive particles are mixed in a synthetic resin. For example, thermal conductive particles of the second thermal conductive member 450 may include $Al_2O_3$ or AlN particles. The synthetic resin of the second conductive member 450 may include a silicon resin or an acrylic resin. The second thermal conductive member 450 may be configured to have relatively high thermal conductivity, compared with an insulation tape. The second thermal conductive member 450 may have thermal conductivity greater than about 2 W/mK. Therefore, the second thermal conductive member 450 may have relatively high heat transfer efficiency, compared with a conventional conductive member including an insulating tape. In order to prevent the conductive plate 440 from being electrically connected to a peripheral metal structure (e.g., the first support member 311 of FIG. 3) in order to prevent a product liability (PL) accident such as an electric shock, the second thermal conductive member 450 may be formed to have a larger area than that of the conductive plate 440. The second conductive member 450 may include a liquid TIM hardened by coating on the conductive plate 440 whose surface is roughly processed in order to remove an air gap generated between the conductive plates 440 and to improve heat transfer efficiency.

Referring to FIG. 4B, through a series of automation processes, a shielding assembly A may be provided in which the shielding member 420 attached to the first thermal conductive member 460, the support member 430, the conductive plate 440, and the second thermal conductive member 450 are sequentially stacked. Such a shielding assembly A is delivered by a predetermined pickup device at an upper surface (e.g., the first surface 4101) of the shield can 410 mounted to enclose the electrical element 341 of the PCB 340 and is pressed at an upper portion of the shield can 410 with a predetermined pressing force to complete assembly.

Figure 5A:
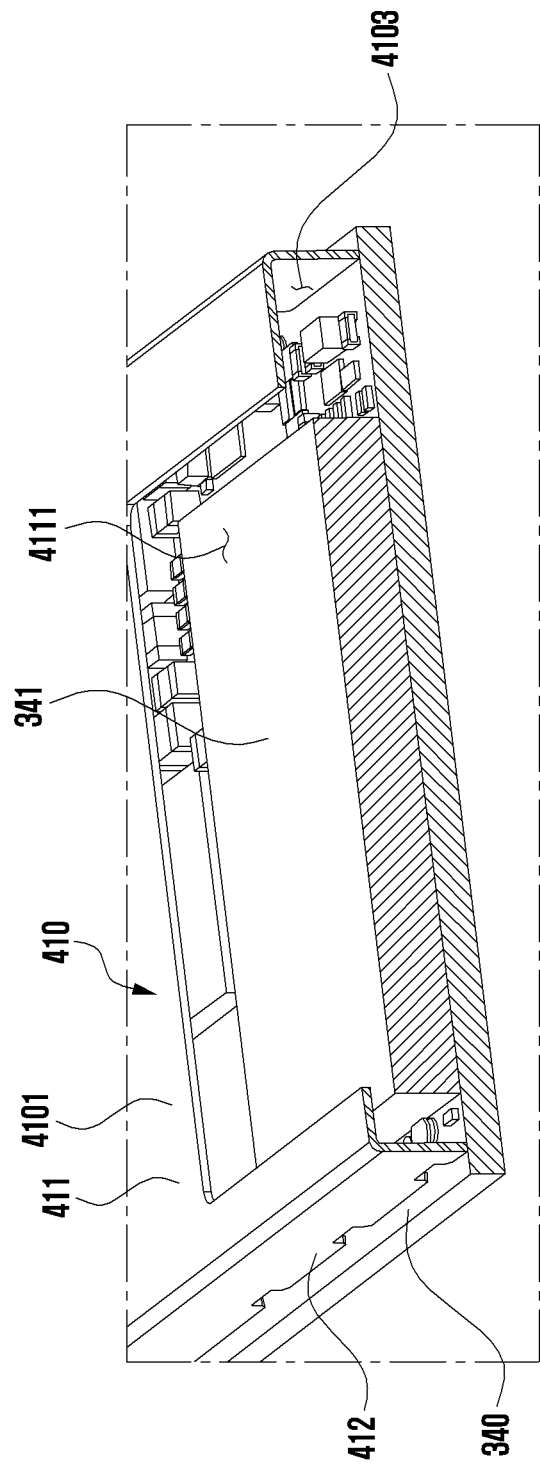
FIG. 5A is a partial perspective view illustrating a state in which a shield can is mounted in a PCB including an electrical element according to an embodiment.
Figure 5B:
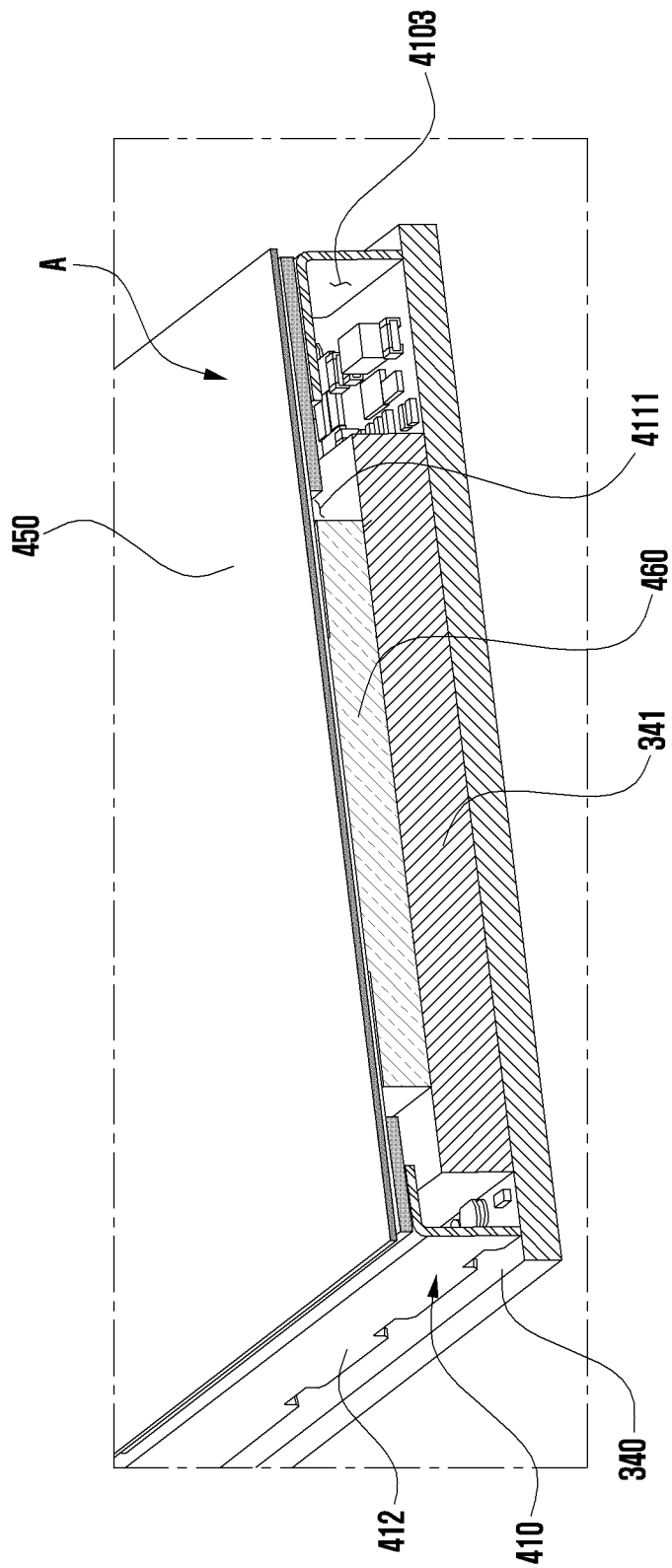
FIG. 5B is a partial perspective view of a shield structure illustrating a state in which a shielding assembly is disposed in an upper part of a shield can according to an embodiment.
Figure 5C:
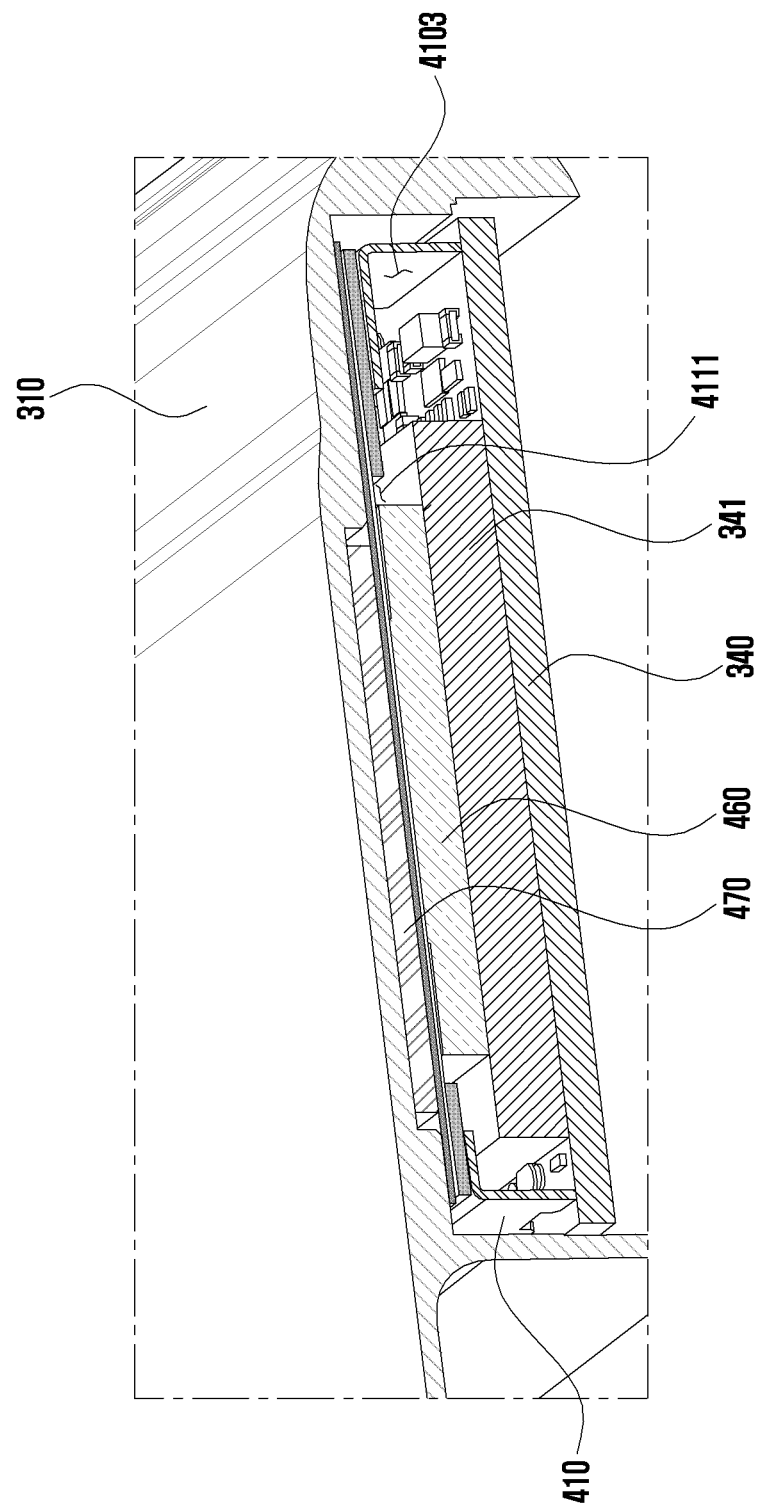
FIG. 5C is a partial perspective view illustrating a state in which a shield structure is coupled to a thermal diffusion structure of an electronic device according to an embodiment.

FIG. 5A is a partial perspective view illustrating a state in which the shield can 410 is mounted in the PCB 340 including the electrical element 341 according to an embodiment. FIG. 5B is a partial perspective view of a shield structure illustrating a state in which a shielding assembly A is disposed in an upper part of the shield can 410 according to an embodiment. FIG. 5C is a partial perspective view illustrating a state in which a shield structure is coupled to a first support member 311 (e.g., a thermal diffusion structure) of an electronic device according to an embodiment.

FIGS. 5A, 5B, and 5C are diagrams illustrating a process of assembling a shield structure (e.g., the shield structure 400 of FIG. 4) by an automation process.

Referring to FIG. 5A, the electrical element 341 may be mounted in the PCB 340. The electrical element 341 may include a processor of the electronic device 300 or a chipset that performs various functions. The shield can 410 may be mounted in the PCB 340 so as to enclose the electrical element 341. In such a case, the electrical element 341 may be disposed to be included in the concave portion 4103 of the shield can 410; and, when viewing from above the shield can 410, at least part of the first opening 4111 may be disposed at a position overlapped with the electrical element 341. Therefore, the electrical element 341 may be disposed so that at least part thereof may be viewed through the first opening 4111.

Referring to FIG. 5B, the shielding assembly A may be disposed at the first surface 4101 (e.g., an upper surface) of the shield can 410 through a predetermined pickup device. As illustrated in FIG. 4A, the shielding assembly A, may be formed in a single product, in which the shielding member 420 attached to the first thermal conductive member 460, the support member 430, the conductive plate 440, and the second thermal conductive member 450 are previously coupled (e.g., adhered or stacked) to each other. Accordingly, the pickup device of the automation process may pick up one shielding assembly A from a cartridge in which a plurality of shielding assemblies A is sequentially arranged to stack the one shielding assembly A in an upper portion of the shield can 410.

Referring to FIG. 5C, after the shielding assembly A is stacked in an upper portion of the shield can 410, a heat radiating member 470 may be additionally disposed to contact in an upper portion of the second heat conductive member 450 of the shielding assembly A. The heat radiating member 470 may include a heat radiating sheet, a heat radiating plate, a heat pipe, and a vapor chamber disposed to contact the second thermal conductive member 450, or a metal structure (e.g., a bracket) including at least one thereof. When the PCB 340 assembled with the shield can 410, the shielding assembly A, and the heat radiation member 470 is assembled in the first support member 311, at least part of the first support member 311 of a metal material may be disposed to contact the heat radiation member 470 to be used as a diffusion and release means of heat emitted from the electrical element 341.

Figure 6:
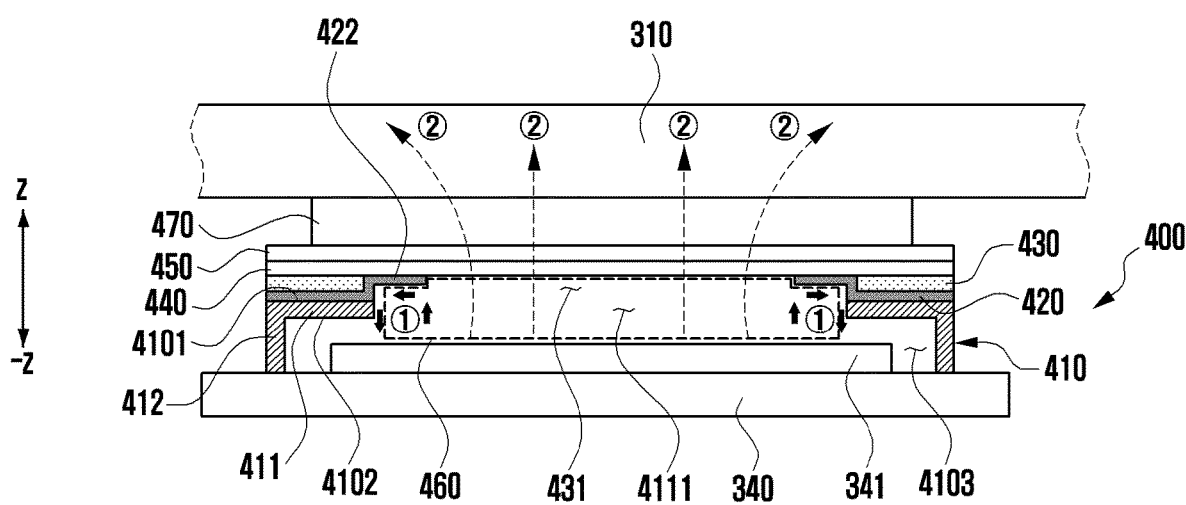
FIG. 6 is a cross-sectional view illustrating a coupled state of a shield structure according to an embodiment.

FIG. 6 is a cross-sectional view illustrating a coupled state of a shield structure 400 according to an embodiment of the present disclosure.

Referring to FIG. 6, the shield can 410 may be disposed in the PCB 340 in which the electrical element 341 is mounted. When viewed from above the shield can 410, the shield can 410 may be mounted so that the first opening 4111 is disposed at a position overlapped with at least part of the electrical element 341. In an upper portion of the shield can 410, the shielding member 420, the support member 430, the conductive plate 440, the second thermal conductive member 450, the heat radiating member 470, and the first support member 311 (e.g., a metal structure) may be sequentially disposed.

The shielding member 420 may be attached to the conductive plate 440 in which the extended portion 422 is exposed in the third opening 431 of the support member 430. Therefore, by forming an electrical connection structure through the first surface 4101 of the shield can 410, the shielding member 420, and the conductive plate 440, noise that may leak through the first opening 4111 of the shield can 410 may be guided in an arrow direction ① from the concave portion 4103 of the shield can 410 to be effectively shielded. Further, because the shielding member 420 and the support member 430 have an inner joint structure through the third opening 431 of the support member 430, a punching process may be performed without a process (e.g., a wrapping process enclosing the outside of the support member) by a separate jig or device; thus the shielding assembly (a) can be easily produced.

In the concave portion 4103 of the shield can 410, in an upper portion of the electrical element 431, the first thermal conductive member 460 may be disposed. As the first thermal conductive member 460 contacts the conductive plate 440 through the first opening 4111 of the shield can 410, the second opening 421 of the shielding member 420, and the third opening 431 of the support member 430, heat generated in the electrical element 341 may be efficiently emitted in an arrow direction ② through the first thermal conductive member 460 (portion indicated by a dotted line in FIG. 6), the conductive plate 440, the second thermal conductive member 450, the heat radiating member 470, and the first support member 311.

Figure 7A:
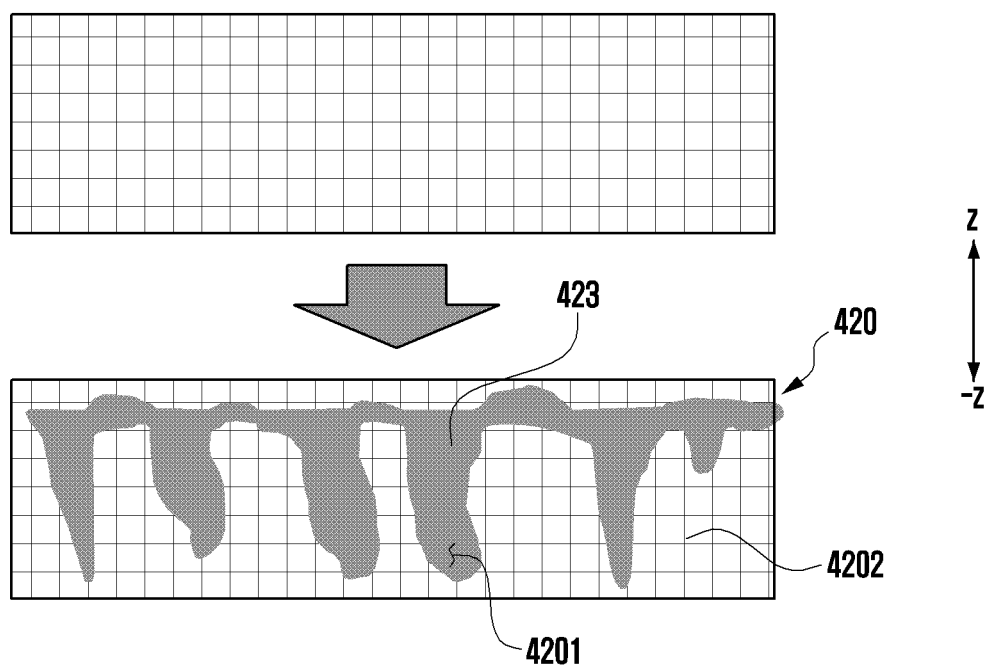
FIGS. 7A and 7B are diagrams illustrating a configuration of a shielding member according to various embodiments.
Figure 7B:
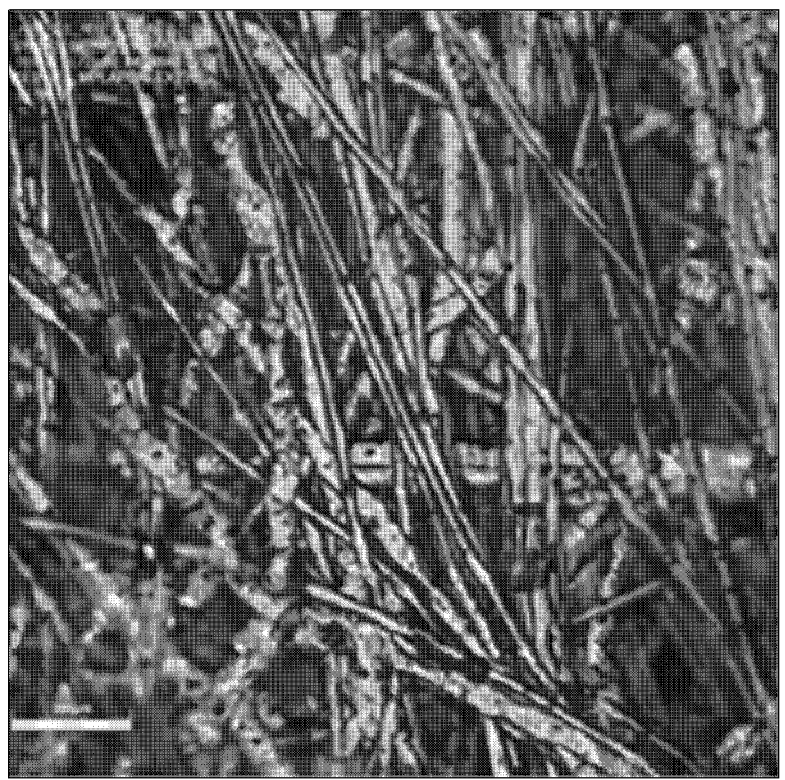

FIGS. 7A and 7B are diagrams illustrating a configuration of a shielding member 420 according to an embodiment.

Referring to FIGS. 7A and 7B, the shielding member 420 may be disposed between the conductive plate 440 and the first surface 4101 of the shield can 410 to shield noise from leaking to the outside along an edge of the first opening 4111. The shielding member 420 may include a plating material 423 penetrated in a vertical direction (e.g., Z and −Z directions of FIG. 7A) to a space 4201 in which a plurality of nano fibers 4202 having a diameter of 300 nm to 700 nm is connected to each other. The plating material 423 may include nickel (Ni) or Cu. Therefore, by securing a vertical resistance relatively lower than that of a conventional shielding member, electrical resistance between the first surface 4101 of the shield can 410 and the conductive plate 440 may be reduced. Thus, the shielding member 420 can perform a more effective shielding function.

FIGS. 8A, 8B, 8C, and 8D are diagrams illustrating various shapes of shielding members 810, 820, 830, and 840 according to various embodiments.

At least one of the shielding members 810, 820, 830, and 840 of FIGS. 8A to 8D may be similar to at least part of the shielding member 420 of FIG. 4A or may include another shielding member.

As described above, in order to enhance shielding performance, an extended portion 422 of the shielding member 420 attached to the conductive plate 440 may be formed in various shapes through an opening 431 of the support member 430.

Figure 8A:
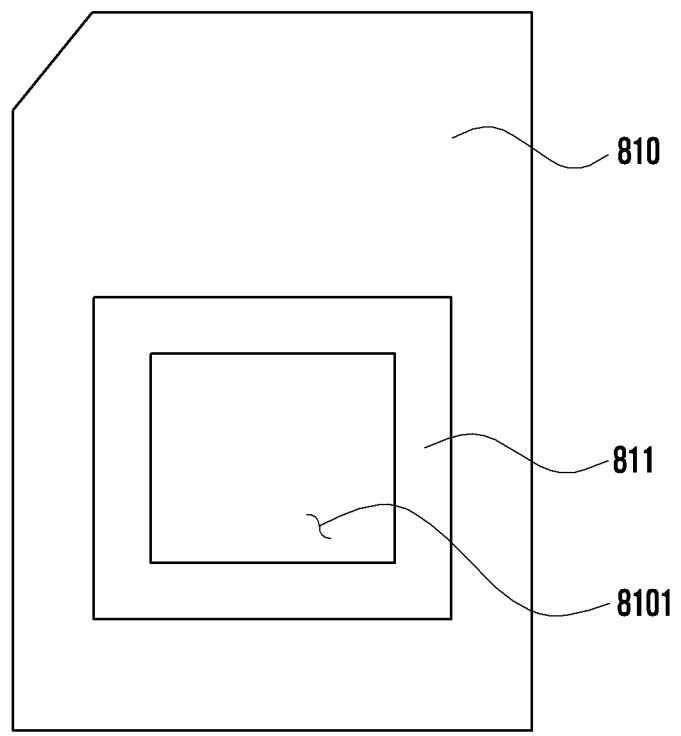
FIGS. 8A, 8B, 8C, and 8D are diagrams illustrating various shapes of a shielding member according to various embodiments.

Referring to FIG. 8A, the shielding member 810 may include a quadrangular opening 8101, and a seamless stepped extended portion 811 may be formed along an edge of the opening 8101.

Figure 8B:
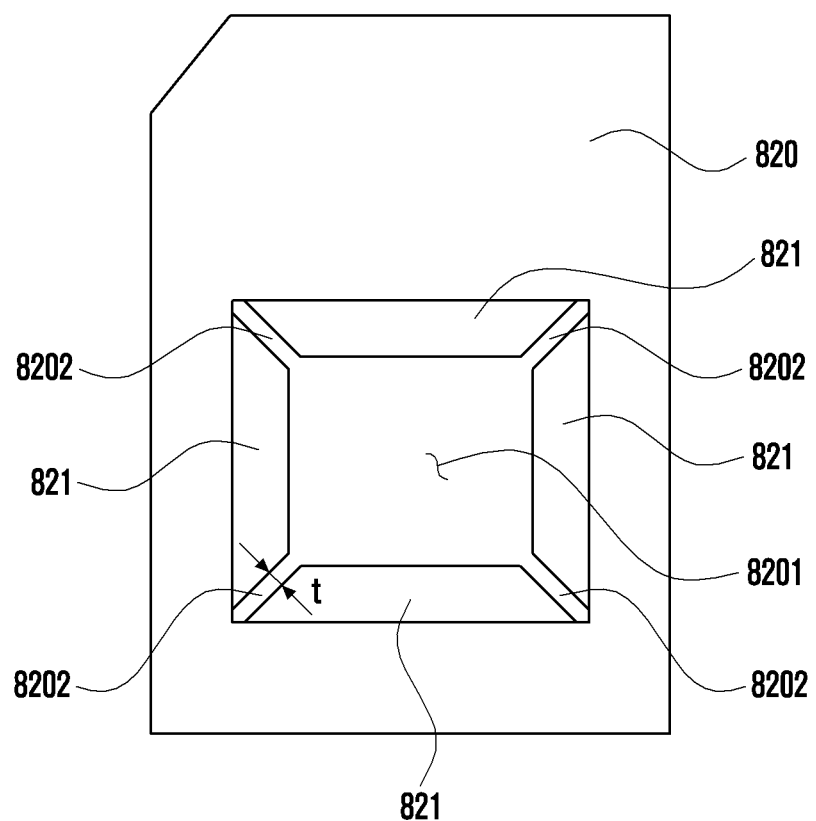

Referring to FIG. 8B, the shielding member 820 may include a quadrangular opening 8201, and when a quadrangular stepped extended portion 821 is formed along an edge of the opening 8201 by a punching process, a lifting phenomenon may occur in a corner portion. In order to prevent such a lifting phenomenon, each corner portion may include a slit 8202 formed by a blade mold. In order to prevent shielding performance from being reduced, the slit 8202 may be formed to have a width (t) in a range of about 0.1 millimeters (mm) to 0.5 mm.

Figure 8C:
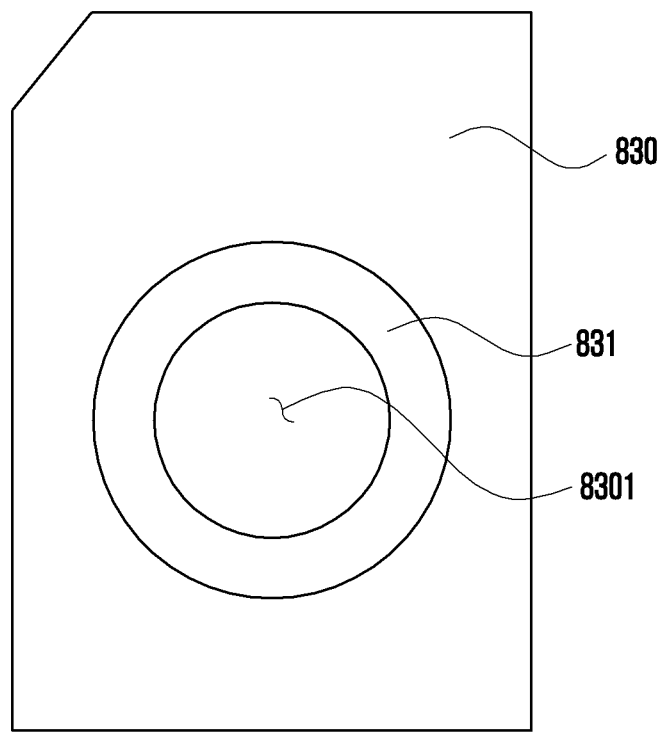

Referring to FIG. 8C, the shielding member 830 may include a circular opening 8301, and a stepped circular extended portion 831 may be formed along an edge of the circular opening 8301.

Figure 8D:
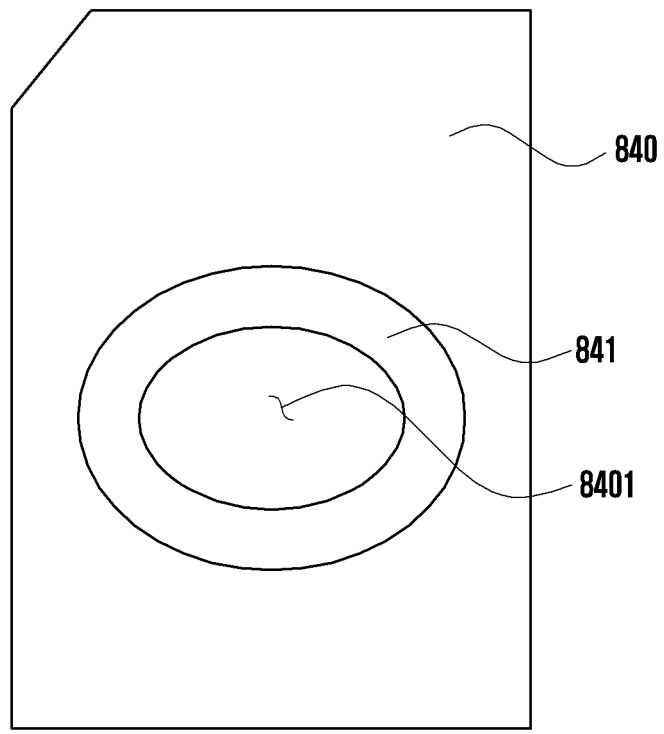

Referring to FIG. 8D, the shielding member 840 may include an oval opening 8401, and a stepped oval extended portion 841 may be formed along an edge of the oval opening 8401.

Therefore, a first thermal conductive member 460 attached to the stepped extended portions 811, 821, 831, and 841 may be formed in a shape corresponding thereto according to a shape of the stepped extended portions 811, 821, 831, and 841.

Shapes of a stepped extended portion formed along an edge of the opening of the shielding member may be formed differently from each other. For example, a shape of the opening may be formed in a circle or an oval, and an entire shape of the stepped extended portion may be formed in a square along the opening. In an embodiment, a shape of the opening may be formed in a quadrangle, and an entire shape of a stepped extended portion may be formed in a circle or an oval along the opening.

Figure 9:
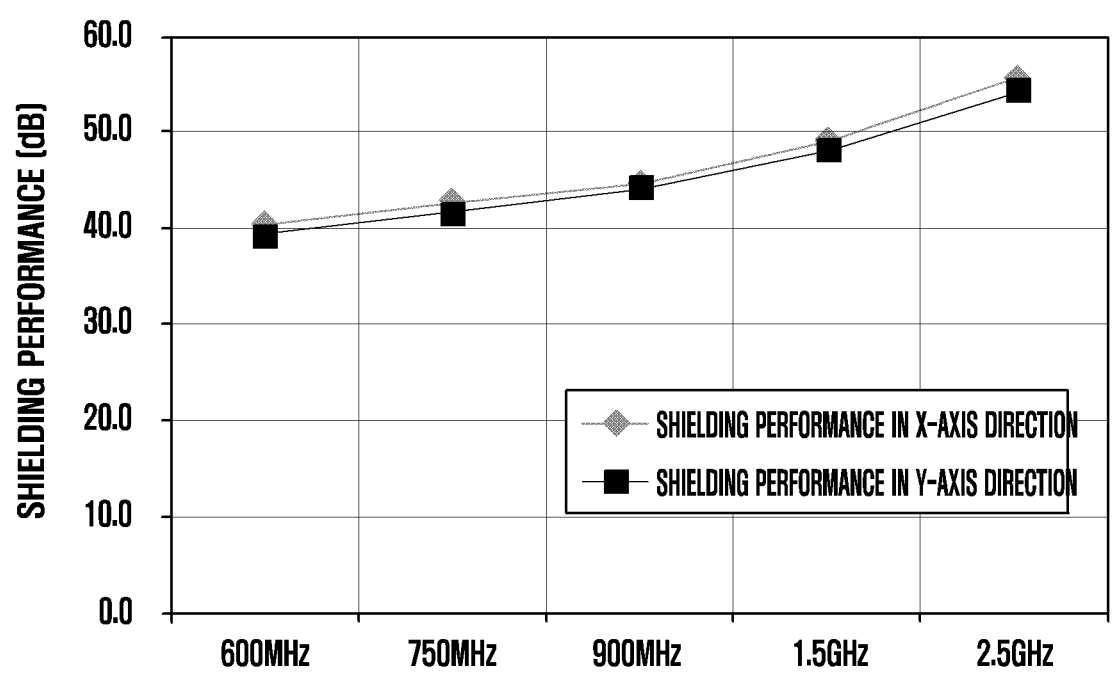
FIG. 9 is a graph illustrating a noise shielding performance exhibited by a shield structure according to various embodiments.

FIG. 9 is a graph illustrating a noise shielding performance exhibited by a shield structure according to various embodiments.

Referring to FIG. 9 and Table 1 below, when the extended portion 422 formed in the shielding member 420 of is attached to the conductive plate 440 of an upper part thereof through the third opening 431 of the support member 430, as a shield in an X-axis direction and Y-axis direction in each frequency (i.e., 600 MHz, 750 MHz, 900 MHz, 1.5 GHz, 2.5 GHz), it can be seen that an excellent shielding performance of more than about 40 dB with an average frequency of about 46.6 dB and about 45.7 dB, respectively, may be exhibited.

TABLE 1

| | Frequency | | | | | |
| --- | --- | --- | --- | --- | --- | --- |
| | 600 MHz | 750 MHz | 900 MHz | 1.5 GHz | 2.5 GHz | Average |
| Shielding performance in X-axis direction (dB) | 40.6 | 42.8 | 44.7 | 49.1 | 55.7 | 46.6 |
| Shielding performance in Y-axis direction (dB) | 39.7 | 41.9 | 44.3 | 48.2 | 54.5 | 45.7 |

This indicates that in order to improve production capability, even if a partial area (e.g., the extended portion 422 of FIG. 4A) of the shielding member 420 embodies an inner shield structure with the conductive plate 440 through the third opening 431 of the support member 430, a high shielding performance may be exhibited.

According to an embodiment, while noise shielding performance of an electrical element is secured, heat radiation performance may be improved and coupling between a shielding member, a support member, and a conductive plate may be simplified, and by mounting a shield structure in an electronic device by an automation process, an assembly process may be improved.

According to an embodiment, an electronic device may include a PCB in which at least one electrical element is disposed, a concave portion, an opening formed in part of the concave portion, a shield can for receiving the at least one electrical element at the inside of the concave portion to be disposed on the PCB, a conductive plate disposed to cover the opening at the outside of the concave portion, a support member disposed between the conductive plate and the outside of the concave portion, and a shielding member disposed between the support member and the outside of the concave portion and connected to at least part of the conductive plate extended in an opening direction from the support member to cover the opening.

The electronic device may further include a thermal conductive member disposed to penetrate the opening and for contacting the at least one electrical element and the conductive plate.

The shielding member may include a shielding opening formed at a position at least partially overlapped with the thermal conductive member and a stepped extended portion formed lower than a periphery with a predetermined width along an edge of the shielding opening.

The thermal conductive member may include a shielding opening to be seated in a stepped extended portion.

The support member may include another opening formed to correspond to the opening of the shield can, and the extended portion may be attached to the conductive plate through the other opening of the support member.

At least part of the thermal conductive member may be disposed to contact the conductive plate through a shielding opening of the shielding member and another opening of the support member.

The shielding member may be formed in a shape of film tape in which a plurality of nano fibers is connected to each other.

The shielding member may include a conductive plating material to be filled in a space formed in a direction parallel to a mounting direction of the shield can by a plurality of nano fibers.

The conductive plating material may include Cu or Ni.

According to an embodiment, an electronic device includes a PCB in which at least one electrical element is mounted; a shield can including a plate in which a first opening is formed and a side surface extended to a predetermined height along an edge of the plate, and disposed on the PCB such that the at least one electrical element is received in a concave portion formed by the side surface and the plate; and a shielding assembly disposed at an outer surface of the plate to seal the first opening, wherein the shielding assembly includes a shielding member attached to an outer surface of the shield can and including a second opening overlapped with at least part of the first opening when viewed from above the shield can; a support member stacked on the shielding member and including a third opening overlapped with at least part of the first opening when viewed from above the shield can; and a conductive plate stacked on the support member and disposed to seal the third opening, wherein at least part of the shielding member adjacent to the second opening is disposed to contact the conductive plate through the third opening.

The electronic device may further include a stepped extended portion formed lower than a periphery with a predetermined width along an edge of the second opening, wherein the extended portion may be attached to the conductive plate.

The shielding assembly may include the second opening and a first thermal conductive member seated in and fixed to the stepped extended portion.

The first thermal conductive member may be disposed to contact at least part of the conductive plate through the second opening and the third opening.

When the shielding assembly is disposed at the shield can, the first thermal conductive member may be disposed to contact at least part of the electrical element.

In the shielding member, a plurality of nano fibers may be formed in a shape of a film or a tape connected to each other.

The shielding member may include a conductive plating material to be filled in a space formed in a direction parallel to a mounting direction of the shield can by a plurality of nano fibers.

The conductive plating material may include Cu or Ni.

The electronic device may further include a second thermal conductive member configured to contact the conductive plate.

The second thermal conductive member may physically contact a metal structure of the electronic device.

According to an embodiment, a shielding assembly attached to an outer surface of a shield can having an opening in a concave portion that can receive at least one electronic component includes a conductive plate, a support member disposed below the conductive plate and in which another opening corresponding to the opening is formed, and a shielding member disposed below the support member and extended in a direction of the opening from the support member to be connected to at least part of the conductive plate covering the opening.

The embodiments of the present disclosure and the accompanying drawings present an example in order to easily describe the disclosure and to facilitate understanding of the present disclosure, but are not intended to limit the scope of the present disclosure. Accordingly, all changes or modifications derived from the technical idea of various embodiments of the present disclosure in addition to the embodiments described herein are intended to be construed as being included in the scope of present disclosure, as defined by the appended claims and their equivalents.

What is claimed is:

1. An electronic device, comprising:
   a printed circuit board (PCB) in which at least one electrical element is disposed;
   a shield can comprising a concave portion and a first opening formed in part of the concave portion and configured to receive the at least one electrical element at an inside of the concave portion disposed on the PCB;
   a conductive plate configured to cover the first opening at an outside of the concave portion;
   a support member disposed between the conductive plate and the outside of the concave portion, wherein the support member comprises a second opening having an area corresponding to that of the first opening; and
   a shielding member disposed between the support member and the outside of the concave portion and connected to at least part of the conductive plate, wherein the shielding member comprises a third opening centered on and having an area smaller than that of the first opening.

2. The electronic device of claim 1, further comprising a thermal conductive member configured to penetrate the opening and contacting the at least one electrical element and the conductive plate.

3. The electronic device of claim 2, wherein:
   the second opening is formed at a position at least partially overlapped with the thermal conductive member; and
   the shielding member further comprises a stepped extended portion formed lower than a periphery with a predetermined width along an edge of the third opening.

4. The electronic device of claim 3, wherein the thermal conductive member is seated in the stepped extended portion of the shielding member.

5. The electronic device of claim 4,
   wherein the extended portion is attached to the conductive plate through the another opening of the support member.

6. The electronic device of claim 5, wherein at least part of the thermal conductive member is configured to contact the conductive plate through the third opening of the shielding member and the second opening of the support member.

7. The electronic device of claim 1, wherein the shielding member is formed in a shape of a film or a tape in which a plurality of nano fibers is connected to each other.

8. The electronic device of claim 7, wherein the shielding member comprises a conductive plating material filled in a space formed in a direction parallel to a mounting direction of the shield can by a plurality of nano fibers.

9. The electronic device of claim 8, wherein the conductive plating material comprises copper (Cu) or nickel (Ni).

10. An electronic device, comprising:
    a printed circuit board (PCB) in which at least one electrical element is mounted;
    a shield can comprising a plate in which a first opening is formed and a side surface extended to a predetermined height along an edge of the plate and disposed on the PCB such that the at least one electrical element is received in a concave portion formed by the side surface and the plate; and
    a shielding assembly disposed at an outer surface of the plate and configured to seal the first opening,
    wherein the shielding assembly comprises:
      a shielding member attached to an outer surface of the shield can and comprising a second opening centered on and having an area smaller than the first opening when viewed from above the shield can;
a support member stacked on the shielding member and comprising a third opening having an area corresponding to that of the first opening when viewed from above the shield can; and
a conductive plate stacked on the support member and configured to seal the third opening,
wherein at least part of the shielding member adjacent to the second opening is configured to contact the conductive plate through the third opening.

11. The electronic device of claim 10, further comprising a stepped extended portion formed lower than a periphery with a predetermined width along an edge of the second opening,
wherein the extended portion is attached to the conductive plate.

12. The electronic device of claim 11, wherein the shielding assembly comprises the second opening and a first thermal conductive member seated in and fixed to the stepped extended portion.

13. The electronic device of claim 12, wherein the first thermal conductive member is configured to contact at least part of the conductive plate through the second opening and the third opening.

14. The electronic device of claim 13, wherein the first thermal conductive member is configured to contact at least part of the electrical element when the shielding assembly is disposed at the shield can.

15. The electronic device of claim 10, wherein in the shielding member, a plurality of nano fibers is formed in a shape of a film or a tape connected to each other.

16. The electronic device of claim 15, wherein the shielding member comprises a conductive plating material filled in a space formed in a direction parallel to a mounting direction of the shield can by a plurality of nano fibers.

17. The electronic device of claim 16, wherein the conductive plating material comprises copper (Cu) or nickel (Ni).

18. The electronic device of claim 10, further comprising a second thermal conductive member configured to contact the conductive plate.

19. The electronic device of claim 18, wherein the second thermal conductive member physically contacts a metal structure of the electronic device.

20. A shielding assembly attached to an outer surface of a shield can having a first opening in a concave portion that is configured to receive at least one electronic component, the shielding assembly comprising:
a conductive plate;
a support member disposed below the conductive plate and in which a second opening is formed having an area corresponding to that of the first opening; and
a shielding member disposed below the support member and connected to at least part of the conductive plate covering the opening, wherein the shielding member comprises a third opening centered on and smaller than the first opening.

* * * * *